United States Patent [19]
Morimoto

[11] Patent Number: 5,179,438
[45] Date of Patent: Jan. 12, 1993

[54] PULSE SIGNAL DELAY DEVICE, AND PULSE SIGNAL PHASE DETECTOR AND CLOCK GENERATOR USING THE DEVICE

[75] Inventor: Takeshi Morimoto, Osaka, Japan

[73] Assignee: Matsushita Electric Industrial Co., Ltd., Osaka, Japan

[21] Appl. No.: 652,110

[22] Filed: Feb. 8, 1991

[30] Foreign Application Priority Data

Feb. 13, 1990 [JP] Japan .................. 2-032052
Feb. 13, 1990 [JP] Japan .................. 2-032053
Oct. 5, 1990 [JP] Japan .................. 2-269102

[51] Int. Cl.⁵ .............. H04N 5/92; H03K 5/153; H03K 5/159
[52] U.S. Cl. ........................ 358/17; 328/63; 328/56
[58] Field of Search ............ 328/63, 151, 56, 55, 328/74; 358/17

[56] References Cited
U.S. PATENT DOCUMENTS
4,443,766 4/1984 Belton, Jr. .

FOREIGN PATENT DOCUMENTS
54-44431 4/1979 Japan .
58-220588 12/1983 Japan .
8701534 3/1987 PCT Int'l Appl. .

OTHER PUBLICATIONS
Ohtusuki, et al "Adaptive Sample Rate Converter": 1989 National Conference, Institute of Television Engineers of Japan, pp. 221-222.

Primary Examiner—Tommy P. Chin
Attorney, Agent, or Firm—Stevens, Davis, Miller & Mosher

[57] ABSTRACT

A pulse signal delay device provides a fixed gate delay time in a digital integrated circuit (such as a CMOS circuit) independently of changes in a power supply voltage or environmental temperature. The device includes a series connection of delay units each having a minimum unit delay time and a circuit for continuously measuring the delay time of each delay unit, wherein a desired delay time is multiplied by the reciprocal of the delay time of each delay unit, and the number of stages of the delay units required for a predetermined delay time is automatically selected on the basis of the multiplication result, thus achieving a stabilized delay time.

3 Claims, 11 Drawing Sheets

F I G. 2
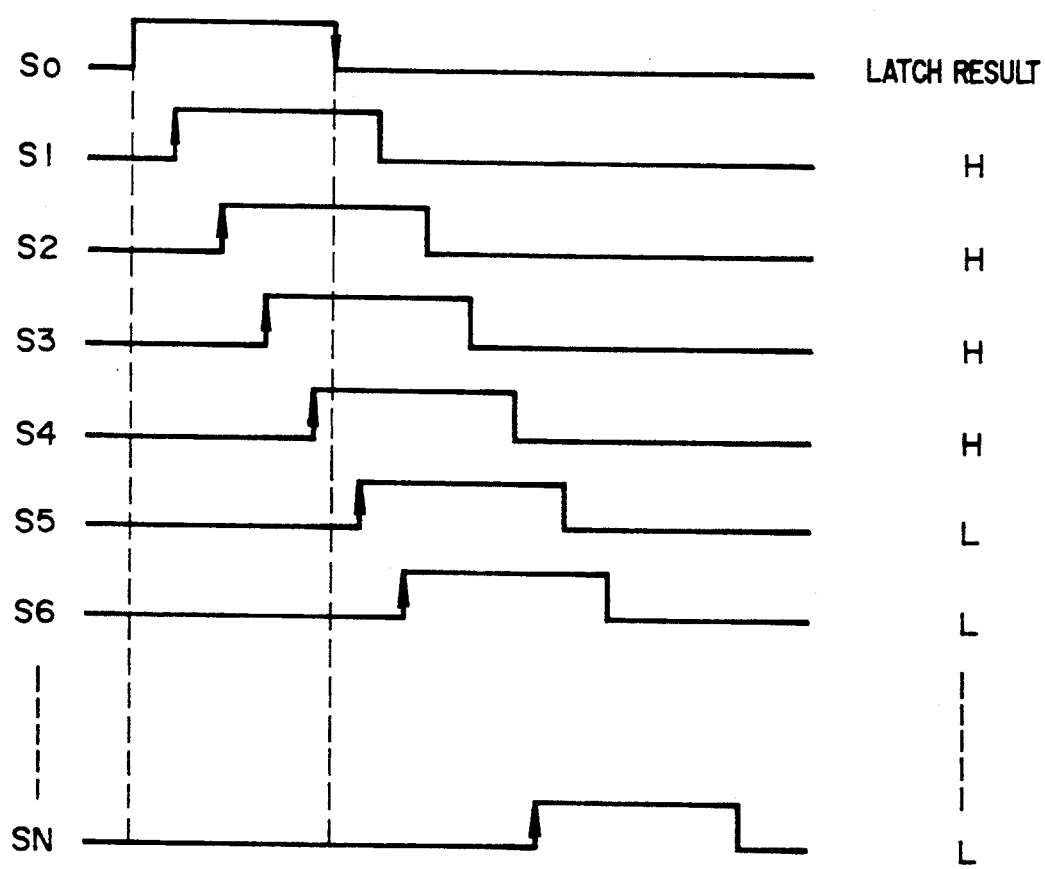

F I G. 10
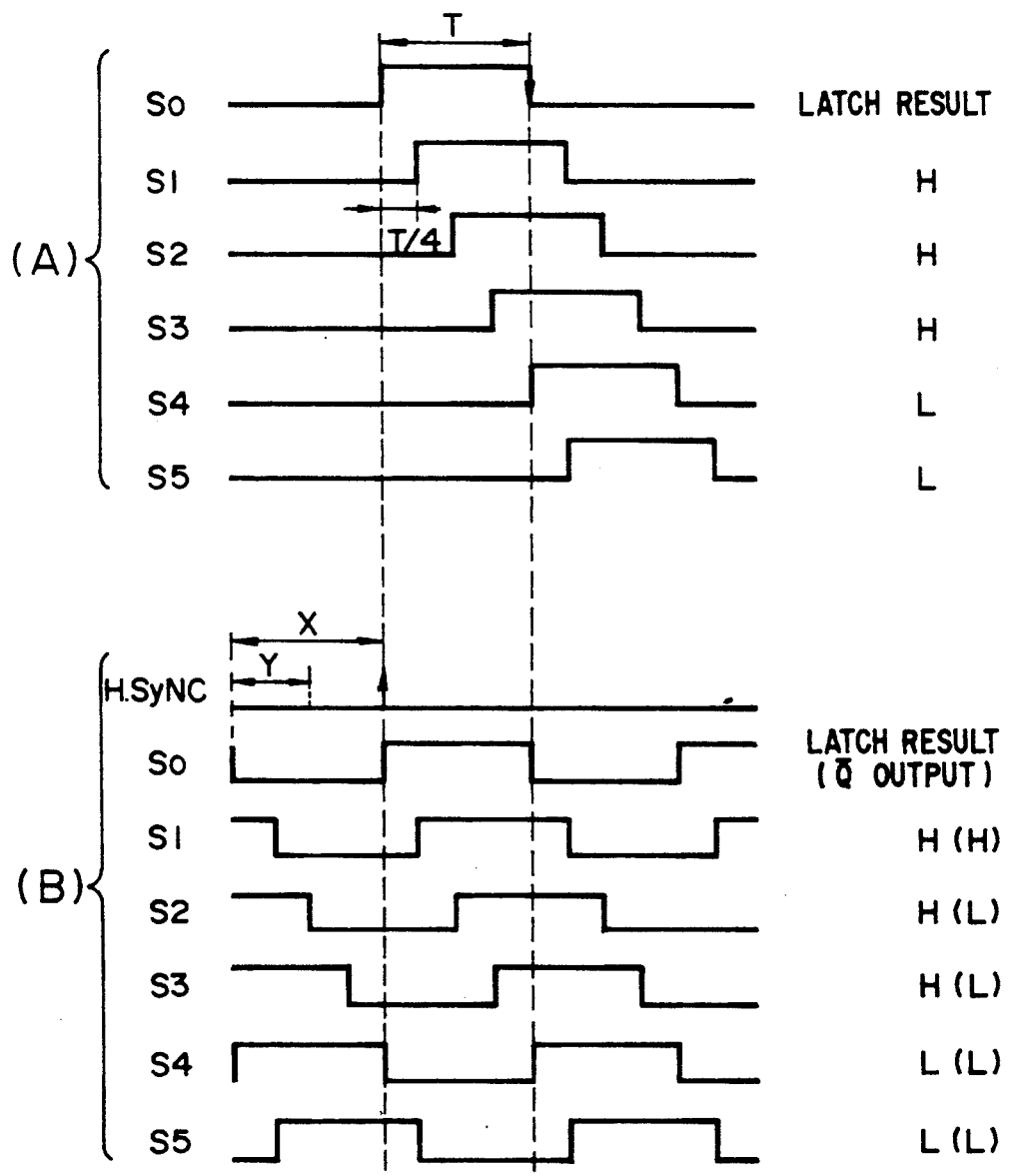

PULSE SIGNAL DELAY DEVICE, AND PULSE SIGNAL PHASE DETECTOR AND CLOCK GENERATOR USING THE DEVICE

BACKGROUND OF THE INVENTION

1. Field of the Invention

The present invention relates to a delay device capable of managing the delay time thereof which can not be accurately defined otherwise, and more particularly to a delay device for delaying a pulse signal using the gate delay in an integrated circuit. The present invention also relates to a phase detector for a pulse signal and a clock generator using the above delay device.

2. Description of the Prior Art

In digital circuit design, frequently, a digital signal such as a pulse signal is delayed by a minute time period in such an arrangement of multi-stage connection of non-inverter TTL (Transistor Transistor Logic) gates having a relatively stabilized delay characteristic.

In JP-A-58-220588 (Reference No. 1), the above arrangement is applied to the clock generator for a time base corrector. In the time base corrector, it is important to provide a high phase accuracy of a generated clock with respect to an input video signal. In view of this, in the above clock generator, the generated clock is applied to a pulse delay device in multi-stage connection of non-inverter gates to prepare several kinds of clocks having different phases; the clock having the most coincident phase with the input video signal is selected among these clocks to prepare the clock with high phase accuracy.

If such a circuit arrangement is designed discretely using TTL devices, unevenness of the delay time thus generated is negligibly small. On the other hand, if this circuit is designed in an integrated circuit comprising CMOS's, the unevenness is noticeably large; this is very problematic.

Most of the gate arrays or standard cells in the latest digital integrated circuits are designed using CMOS's. However, CMOS has a defect that its gate delay characteristic is greatly influenced by a power supply voltage, environmental temperature, or electrical load. It has been generally believed that it is impossible to take a constant delay time using gate delay in the digital integrated circuit.

Meanwhile, disclosed in the proceedings (Reference No. 2) for the 1989 national conference of the institute of television engineers of Japan is a method of positively using the changing characteristic of a power supply voltage versus a gate delay time to provide a circuit for controlling the power supply voltage, thereby controlling the delay time so that it is maintained constant. However, in the case of an application of an integrated circuit, it is very difficult to control the power supply voltage within the integrated circuit.

The most common technique of detecting the phase of a pulse signal was to use a charge pumping circuit (to change a phase difference into a voltage) in an analog circuit design. However, to implement it in a digital integrated circuit was difficult for the above reason.

Further, in a clock generator used to generate e.g. a color subcarrier in a PAL system, it is difficult in terms of the synchronization accuracy of the clock to phase-modulate a horizontal synchronization signal to directly generate the color subcarrier. In view of this, it was proposed in JP-A-54-44431 (Reference No. 3) to generate the color subcarrier using a technique such as digital phase modulation.

SUMMARY OF THE INVENTION

A first object of the present invention is to provide a delay device for delaying a pulse signal with a circuit for measuring the gate delay time to arrange the delay device having a fixed delay time in a multi-stage connection of gates, thereby providing the delay device for the pulse signal suitable to be implemented in an integrated circuit.

A second object of the present invention is to apply the above delay device to a pulse signal phase detector and to a clock generator ro construct the entire circuit digitally, thereby realizing the phase detector and clock generator in a digital integrated circuit.

The delay circuit for delaying a pulse signal comprises delay means constructed by an N-stage connection in series of delay units each having a minimum unit delay time, delay stage number measuring means for measuring the number of stages of the delay units in the delay means which is necessary to delay a reference signal applied to the delay means by a fixed time T, selection means for selecting the outputs from the individual stages of the delay units, and multiplying means for multiplying the output value k from the delay stage number measuring means by a coefficient $\alpha$ and controlling the selection means in terms of the output value $\alpha k$ thus obtained, wherein the output from $\alpha k$-th stage in the delay units is selected by the selection means to obtain a desired delay time $\alpha T$.

In such an arrangement, the present invention is constructed in such a manner that in the delay line formed by a multi-stage connection in series of delay units each having a minimum unit delay time, a circuit for measuring the delay time of the delay line to continuously measure the delay time of each delay unit, a desired delay time is multiplied by the reciprocal of the delay time of each delay unit, and the stage number of the delay units is automatically selected on the basis of the multiplication result. Thus, even if the delay time of each delay unit is changed owing to e.g. changes in a power supply voltage or environmental temperature, the entire delay device can always provide a fixed delay time.

According to the present invention, even where the gate delay within a digital integrated circuit is used to delay a pulse signal, the delay device which can always provide a fixed delay time is realized.

Further, the pulse signal phase detector of the present invention deals with a composite video signal using the above pulse signal delay device, which detects the phase relationship (SCH) between a subcarrier signal (SC) and a horizontal synchronization (sync) signal (H). This phase detector comprises sync separation means for extracting a horizontal sync signal from a composite video signal, clock reproduction means for preparing a sync clock in phase with the color subcarrier included in the composite video signal, pulse generating means for generating a pulse signal having the pulse width of a predetermined time T, delay means in the form of an N-stage connection in series of delay units each having a minimum unit delay time, a plurality of latch means corresponding to respective delay units, encoding means for encoding the outputs from the plurality of latch means and division means, whereby the phase difference between the horizontal sync signal and the sync clock is extracted, the number of stages of the delay units in the delay means necessary to delay a pulse signal by a predetermined time T on the basis of the pulse signal having the width of the predetermined time T is measured, and the phase difference is divided by the stage number using the division means to obtain the SCH information. In accordance with the present invention, the pulse signal phase detecting circuit, which could be constructed only by the charge pumping circuit which is an analog circuit, can be realized in a digital circuit, and is also adapted to manage stably the delay time irrespective of changes in a power supply voltage or environmental temperature. Thus, the pulse signal phase detecting circuit according to the present invention can be integrated in a digital circuit.

The clock generator according to the present invention is intended to prepare the color subcarrier with 25 Hz offset of a PAL signal. To this end, the color subcarrier generating device according to the present invention comprises sync separation means for separating the horizontal and vertical sync signals of a video signal from each other, phase modulation signal preparing means for preparing a phase modulation signal α on the basis of the horizontal and vertical sync signals from the sync separation means, phase shifting means, controlled by the phase modulation signal α, for phase-shifting the horizontal sync signal from the sync separation means, and multiplying means for frequency-multiplying the output from the phase shifting means to provide a color subcarrier. Accordingly, by using the phase modulation means with a stabilized time base, the phase shift of the horizontal sync signal is stabilized, which is suppiied to the multiplying means so that the color subcarrier having 25 Hz offset in a PAL system can be directly generated from the horizontal sync signal in a simple circuit structure. Further, in the case where the gate delay within a digital integrated circuit is used for the delay units constituting the phase shifting means, the phase shifting means as a whole can always provide a stabilized phase shift irrespectively of a change in the delay time of each delay unit owing to changes in a power supply voltage or environmental temperature. Thus, a circuitry suited for a digital integrated circuit can be realized.

BRIEF DESCRIPTION OF THE DRAWINGS

FIG. 2 is a timing chart of the first embodiment of the delay device for delaying a pulse signal;

FIG. 10 is a timing chart of the second embodiment of the pulse signal phase detector.

DESCRIPTION OF THE PREFERRED EMBODIMENTS

First, in order to clarify the application field of the pulse signal delay device according to the present invention, the input portion of an analog input signal in a digital VTR will be explained with reference to FIG. 5.

Figure 5:
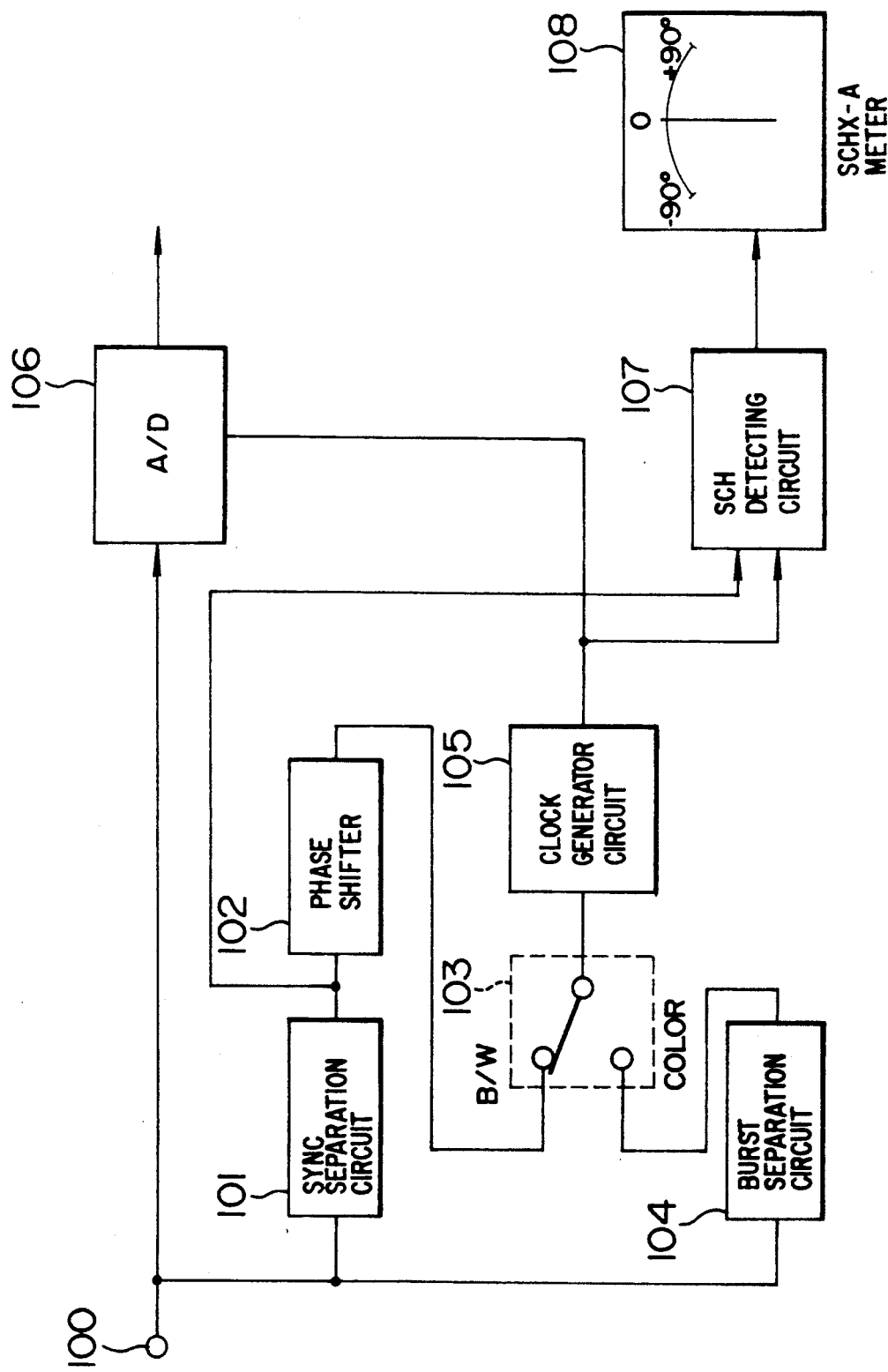
FIG. 5 is a block diagram for explaining the video signal input portion of a digital VTR to which the pulse signal delay device of the present invention is applied.

FIG. 5 shows an example of the digital VTR for recording a composite video signal. As seen from FIG. 5, the composite analog video signal is input at an input terminal 100, sampled by an A/D converter 106, and the sampled signal is sent to a digital record processing circuit by which the signal is recorded. The composite video signal is also sent to a sync separation circuit 101 in which a horizontal sync signal is separated and to a burst separation circuit 104 in which a burst signal is separated.

A phase shifter 102 is a circuit used when the composite video signal is a PAL signal and serves to modulate the phase of the horizontal sync signal obtained through the sync separation. A switch 103 is switched in accordance with the kind of the video signal. Specifically, if the video signal is a color signal with a burst, the switch 103 is connected with the side of color; if it is a monochromatic signal free form the burst is connected with the side of B/W.

A clock generating circuit 105 is intended to prepare a clock for sampling the video signal. Specifically, in the case of the color signal, the clock is made from the burst signal in the composite video signal, whereas in the case of the monochromatic signal, the clock is made from the phase-modulated horizontal sync signal. An SCH detection circuit 107 serves to detect the phase relationship (SCH) between the horizontal sync signal in the input video signal and the burst signal or the clock in synchronism with it, thereby performing a digital record processing and color frame management in a servo circuit. 108 is a meter for displaying the SCH.

The present invention provides a device for delaying a pulse signal formed by a multi-stage series-connection of digital gates so that it is applied to the phase shifter 102 or the SCH detecting circuit 107 at the input portion of an analog video signal in the above digital VTR.

The present invention will be explained in detail below.

Figure 1:
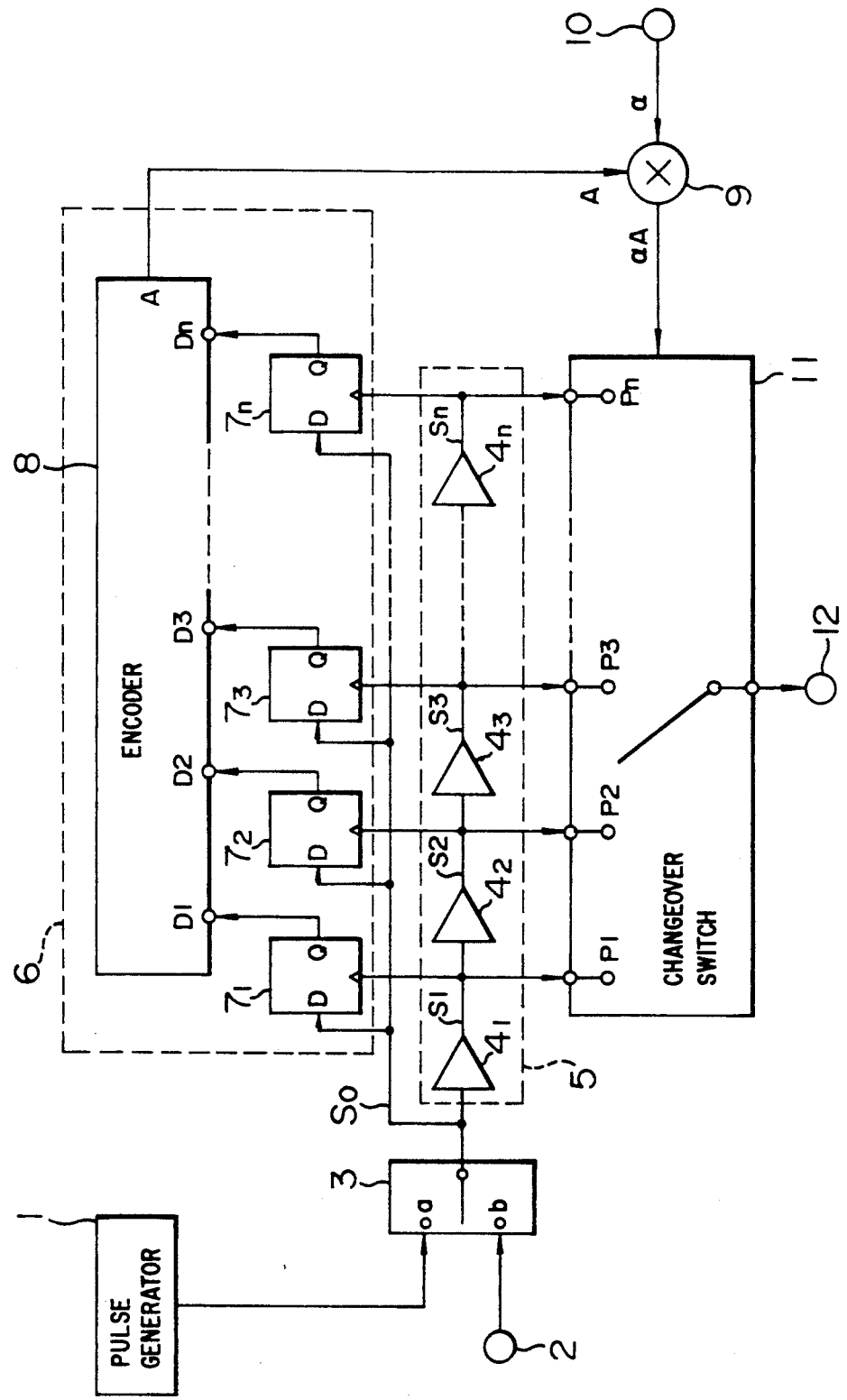
FIG. 1 is a block diagram of a first embodiment of the delay device for delaying a pulse signal.

Now referring to FIG. 1, an explanation will be given of a first embodiment of the pulse signal delay device according to the present invention. In FIG. 1, 1 denotes a pulse generator used for measuring the delay time of a delay line, which generates pulses each having the width of a predetermined time T on the basis of clocks produced from e.g. a quartz oscillator; 2 denotes an signal input terminal; 3 a switch; 41, 42, 43, . . . , 4n denote non-inverter gates (delay units); 5 a delay line (delay means) composed of the delay units; 6 a device for measuring a delay time; 71, 72, 73, . . . , 7n latch circuits; 8 an encoder circuit; 9 a multiplier; 10 a terminal for inputting a set value of the delay time; 11 a changeover switch; and 12 a signal output terminal. The delay line 5 is formed by an N-stage connection in series of the non-inverter gates (41, 42, 43, . . . , 4n). The delay time measuring device 6 is composed of n latch circuits 71 to 7n using as clocks the outputs form the non-inverter gates 41 to 4n respectively, and the encoder circuit 8.

The encoder circuit 8 examines the outputs from the latch circuits successively in the direction of the first stage to the succeeding stage of the delay units to 4n and measures the number of stages of the delay units 41 to 4n where a difference first appears in the outputs of a unit of the latch circuit 7 compared to that of one unit before. The operation of measuring the delay time will be explained with reference to FIGS. 1 to 3. The switch 3 is usually located on the side of b to supply the signal from the signal input terminal 2 to the delay line 5. In measuring the delay time, the switch 3 is connected with the side of a to supply a pulse signal S0 having a predetermined time width T from the pulse generator 1 to the first stage delay unit 41 and the data input terminals of all the latch circuits 71 to 7n. As seen from FIG. 2, with increasing number of stages of the delay units 41 to 4n, the pulse signals S1, S2, S3, . . . , Sn output from the respective delay units 41 to 4n result in pulses time-delayed by the corresponding number of the units. Now it is assumed that the input pulse signal S0 is latched by each of the latch circuits 71 to 7n using the leading edge of each pulse signal delayed by a different delay time from each of the delay units 41 to 4n. Then, as seen from FIG. 2, latching with each of the pulse signals S1, S2, S3 and S4 provides the result of an H level whereas latching with each of the pulse signals S5, S6, . . . , Sn provides the result of an L level. In other words, the latch circuits 71, 72, 73 and 74 in FIG. 1 produce the H level results whereas the succeeding latch circuits 75, . . . , 7n produce the L level results. These results are supplied to the encoder circuit 8.

Figure 3:
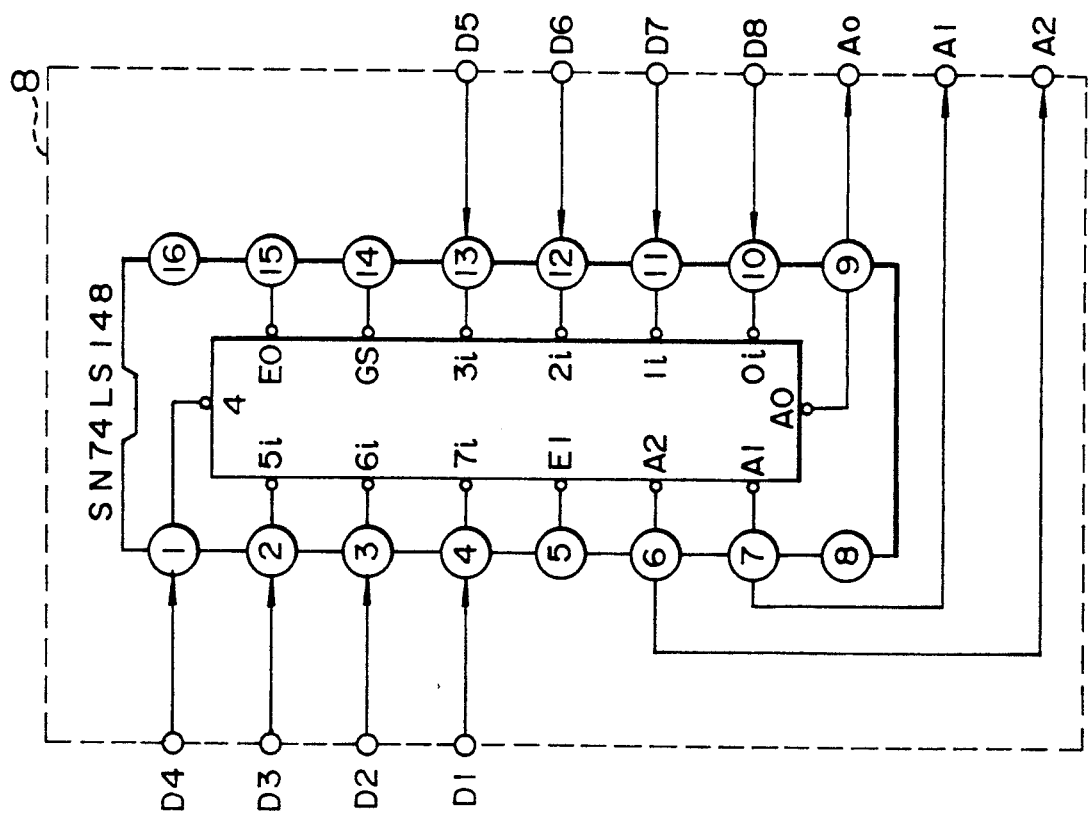
FIG. 3 is a diagram showing an example of the integrated circuit used for an encoder in the pulse signal delay device according to the present invention.

As shown in FIG. 3, the encoder circuit 8 is constructed by e.g. a parity encoder (SN74LS148) in the form of a general TTL-IC alone or in a series-connection of these encoders. In FIG. 3, D1, D2, . . . , D8 correspond to the input terminals D1, D2, . . . , D8 of the encoder circuit 8 in FIG. 1, and the outputs from the latch circuits 71 to 7n are supplied to D1, D2, . . . , in the order starting from the first stage latch circuit 71. Further, in FIG. 3, A0(LSB), A1 and A2, corresponding to an output A (indicative of the number of delay units required to provide a predetermined delay time T) from the encoder circuit 8 in FIG. 1, are supplied to the multiplier 9 as the data of a plurality of bits. When the latch results as shown in FIG. 2 are input to the input terminals D1, D2, D3, D4, . . . , the result of A=4 (A2="H", A1="L", A0="L"), is output on the basis of FUNCTION TABLE as shown in FIG. 3. This result A means that in order to provide the delay time of a predetermined time width T, a series-connection of 4 (four) stages of delay units is required.

Accordingly, in order for the delay device in FIG. 1 as a whole to provide the delay time of $\alpha T$ obtained by multiplying the predetermined time T by an optional coefficient $\alpha$, the data of the coefficient $\alpha$ input from the terminal 10 for inputting a set value of the delay time is multiplied by the output A indicative of the number of required delay units and the changeover switch 11 is controlled on the basis of the result of the multiplication. For example, if A=4 and $\alpha=0.5$, $\alpha A=2$. In this case, if the changeover switch 11 selects an input at the second input terminal P2 (i.e. an output from the second stage delay unit 42), the delay device as a whole can realize the delay time of 0.5 T. Further, if the gate delay characteristic is changed owing to changes in a power supply voltage or environmental temperature so that the delay in each delay unit becomes half, A=8 is obtained. Therefore, with $\alpha=0.5$, $\alpha A=4$. In this case also, if the changeover switch 11 selects an input at the fourth input terminal (an output from the fourth stage delay unit 44), the delay unit as a whole can realize the delay time of 0.5 T.

Figure 4:
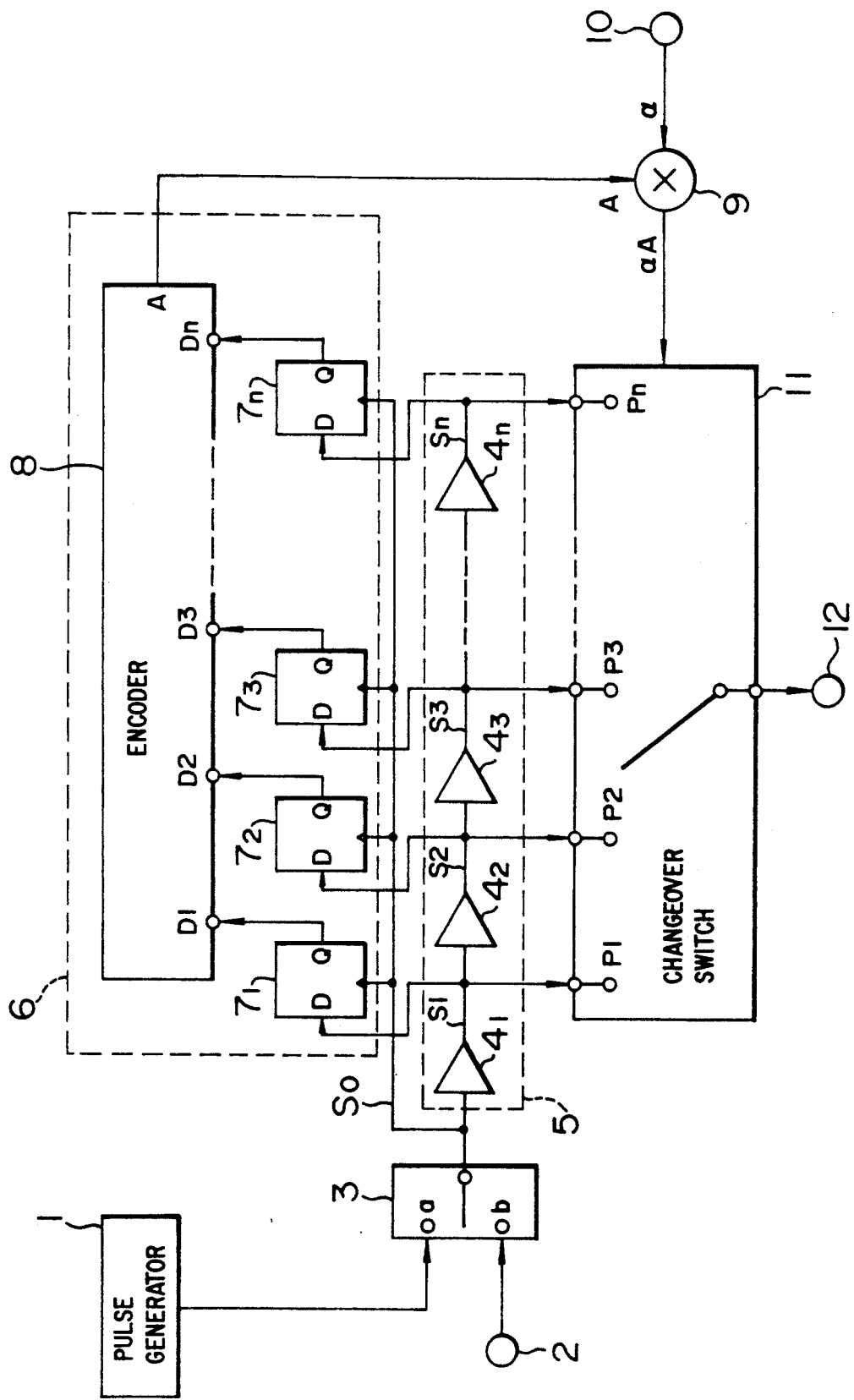
FIG. 4 is a block diagram of a second embodiment of the delay device for delaying a pulse signal.

Now referring to FIG. 4, an explanation will be given of a second embodiment of the pulse signal delay device according to the present invention. This embodiment has the same constituent elements as those in the embodiment of FIG. 1. However, in this embodiment, the relationship between the data inputs and the clock input of the latch circuits 71 to 7n is reverse to that in FIG. 1. Specifically, in this embodiment, the pulse signal S0 from the switch circuit 3 is supplied to the first stage delay unit 41 and the clock input terminals (but not data input terminals) of all the latch circuits 71 to 7n whereas the pulse signals S1, S2, S3, . . . , Sn output from the delay units 41 to 4n are supplied to the data input terminals D (but not clock input terminals) of the latch circuits 71 to 7n, respectively.

In the embodiment of FIG. 1, the input pulse signal S0 is latched in the latch circuits 71 to 7n with the latch circuits 71 to 7n with the leading edges of the pulse signals time-delayed by several times by the delay units 41 to 4n, whereas in this embodiment, the pulse signals time-delayed by several times by the delay units 41 to 4n are latched with the trailing edge of the input pulse signal S0 in the latch circuits 71 to 7n. The operation of FIG. 4 can be explained with reference to FIG. 2 in the same manner as in FIG. 1. Thus, in accordance with this embodiment, entirely the same result as in FIG. 1 can be obtained so that the delay device as a whole according to this embodiment can perform the same operation as in the embodiment of FIG. 1.

In such an arrangement, the present invention is constructed in such a manner that in the delay line formed by a multi-stage connection in series of delay units each having a minimum unit delay time, a circuit for measuring the delay time of the delay line to continuously measure the delay time of each delay unit, a desired delay time is multiplied by the reciprocal of the delay time of each delay unit, and the stage number of the delay units is automatically selected on the basis of the multiplication result. Thus, even if the delay time of each delay unit is changed owing to e.g. changes in a power supply voltage or environmental temperature, the delay device as a whole can always provide a fixed delay time. Further, in accordance with the present invention, even where the gate delay within a digital integrated circuit is used to delay a pulse signal, the delay device which can always provide a fixed delay time can be realized.

Figure 6:
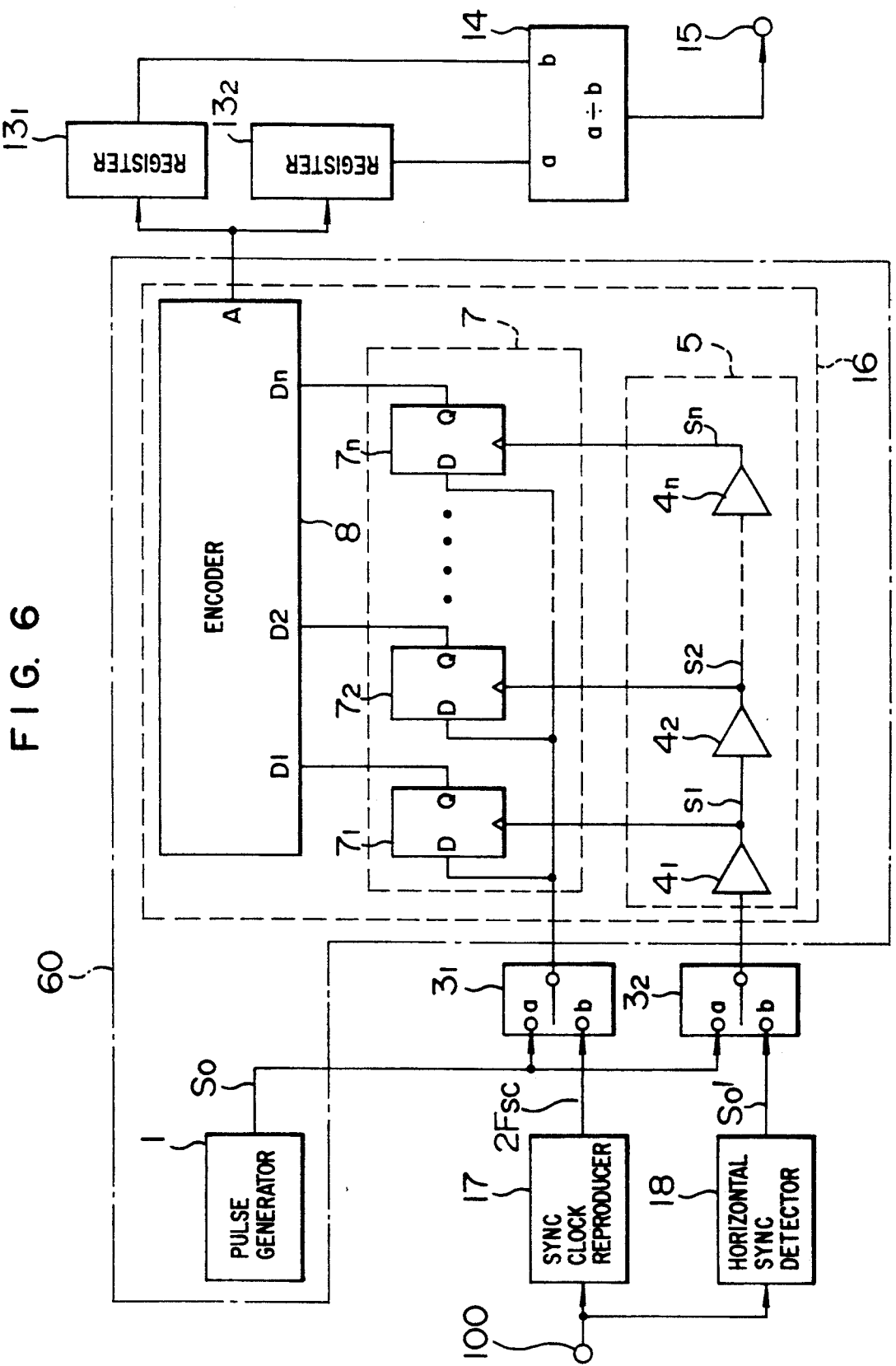
FIG. 6 is a block diagram of a first embodiment of the pulse signal phase detector realized using the pulse signal delay device (FIGS. 1 and 4) according to the present invention.

An explanation will be given of the phase detector (SCH detector as shown in FIG. 5) to which the first embodiment of the pulse signal delay device according to the present invention is applied. FIG. 6 shows a first embodiment of the detector for detecting the phase of a pulse signal according to the present invention.

In FIG. 6, 1 denotes a pulse generator for generating the pulse used to measure the delay time of a delay line. This pulse generator generates a pulse with a predetermined time width T on the basis of a clock generated from e.g. a quartz oscillator. 100 denotes a composite video signal input terminal; 31 and 32 are switches; 41, 42, 43, . . . , 4n denote non-inverter gates (delay units); 5 a delay line (delaying means) composed of delay units; 71, 72, . . . , 7n latch circuits; 8 an encoder circuit; 131 and 132 registers; 14 a divider; 15 an SCH information output terminal; 60 a delay time measuring device composed of the pulse generator 1, the delay line 5, a latch circuit group 7 and the encoder 8; 16 denotes a phase difference extracting circuit composed of the delay line 5, the latch circuit group 7 and the encoder 8; 17 denotes a sync clock reproducing device for preparing a color subcarrier being in phase with the burst signal of the composite video signal and having the frequency twice that of the burst signal; and 18 denotes a horizontal sync detecting device for extracting a horizontal sync signal from the composite video signal. The encoder circuit 8 examines the outputs from the latch circuits successively in the direction of the first stage to the succeeding stage of the delay units 41 to 4n and measures the number of stages of the delay units 41 to 4n where a difference first appears in the output of a unit of the latch circuit 7 compared to that of one unit before.

Now referring to FIGS. 6, 7 and 3, an explanation will be given of the operation of the delay time measuring device 60. In measuring the delay time, the switch 3 is connected with the side of $\bar{a}$ to supply a pulse signal S0 having a predetermined time width T from the pulse generator 1 to the first stage delay unit 41 and the data input terminals of all the latch circuits 71 to 7n. As seen from FIG. 7A, with increasing number of stages of the delay units 41 to 4n, the pulse signals S1, S2, S3, ..., Sn output from the respective delay units 41 to 4n result in pulses time-delayed by the corresponding number of the units.

Figure 7:
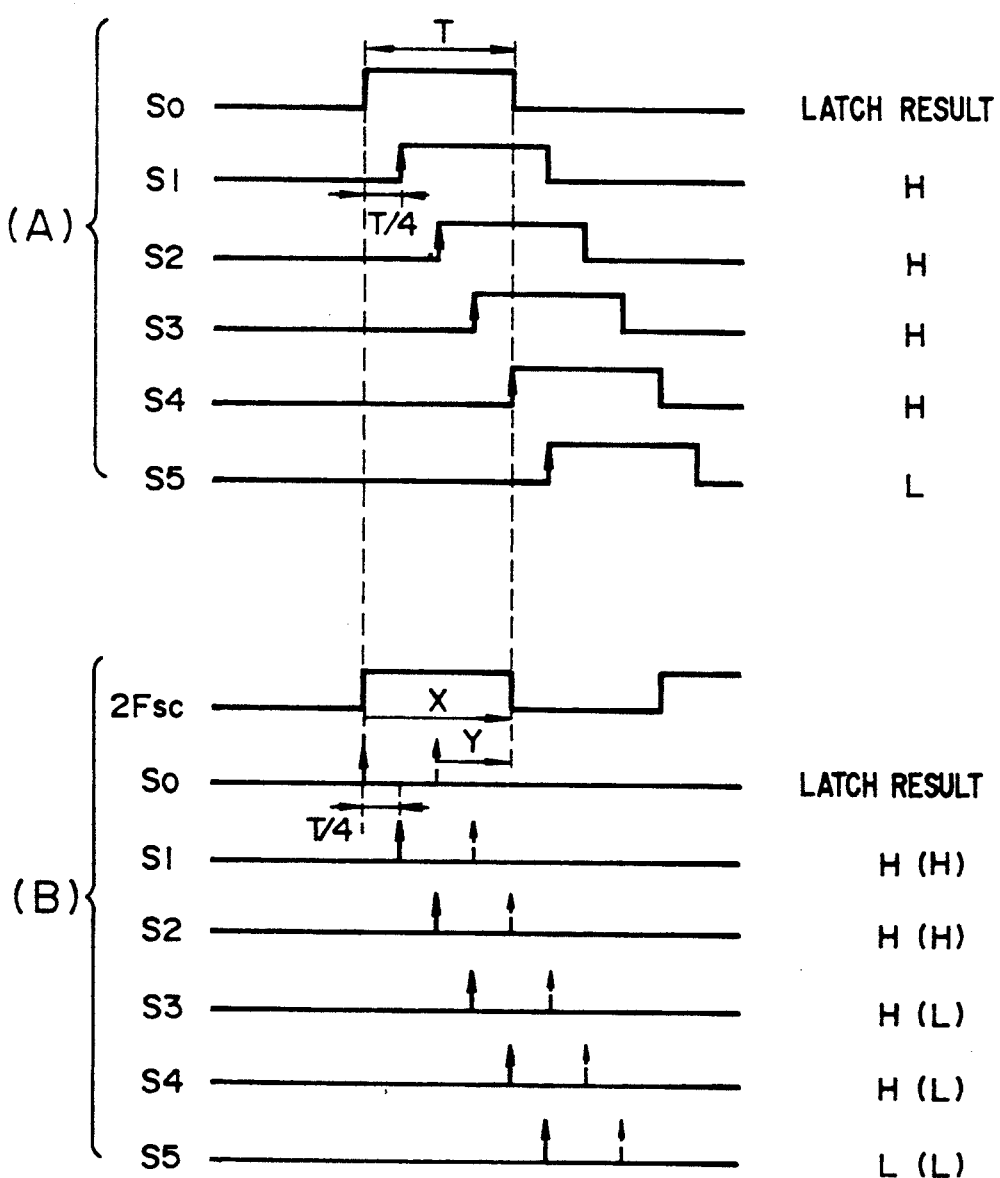
FIGS. 7 and 8 are timing charts of the first embodiment of the pulse signal phase detector.

In FIG. 7, T is taken as the width of one clock period of a four-times subcarrier signal (4Fsc) and the delay amount per one stage of the delay units is taken as T/4.

Now it is assumed that the input pulse signal S0 is latched by each of the latch circuits 71 to 7n using the leading edge of each pulse signal delayed by a different delay time from each of the delay units 41 to 4n. Then, as seen from FIG. 7, latching with each of the pulse signals S1, S2, S3 and S4 provides the result of an H level whereas latching with each of the pulse signals S5, S6, ..., Sn provides the result of an L level. The results thus obtained are input to the encoder circuit 8 as shown in FIG. 3; as a result, an output from the encoder circuit, i.e. the result of A=4 (A2="H", A1="L", A0="L") is stored in the register 131. This result A means that in order to provide the delay time of a predetermined time width T, a series-connection of 4 (four) stages of delay units is required.

The operation of the phase difference extracting circuit will be explained with reference to the timing chart of FIG. 7. In extracting the phase difference, the switches 31 and 32 are connected with the side b to supply the horizontal sync signal S0' from the horizontal sync detector 18 to the first stage delay unit 41 and to supply the color subcarrier (2Fsc) having the frequency twice that of the subcarrier from the sync clock reproducing device 17 to the respective data input terminals of the all of the latch circuits 71 to 7n.

It is assumed that the 2Fsc signal is latched by each of the latch circuits 71 to 7n using the leading edge of each pulse signal delayed by a different delay time from each of the delay units 41 to 4n, and the input horizontal sync signal in the timing indicated by a solid line arrow as in FIG. 7B. Then, as seen from FIG. 7B, latching with each of the pulse signals S1, S2, S3 and S4 provides the result of an H level whereas latching with each of the pulse signals S5, S6, ..., Sn provides the result of an L level. The results thus obtained are input to the encoder circuit 8 as shown in FIG. 3; as a result, an output from the encoder circuit, i.e. the result of A=4 (A2="H", A1="L", A0="L") is stored in the register 132. This result A indicates the phase difference (X in FIG. 7B) between the horizontal sync signal S0' and 2Fsc. The content (phase difference information) of the register 132 is divided by the content (number of the delay units required to provide a predetermined time T) of the register 131 in the divider 141; the division result 4/4=1 provides SCH of 1.

Now it is assumed that the input horizontal sync signal is displaced from the timing indicated by the solid line arrow to the timing indicated by a broken line arrow in FIG. 7B. Then, as seen from FIG. 7B, latching with each of the pulse signals S1 and S2 provides the result of an H level whereas latching with each of the pulse signals S3, S4, ..., Sn provides the result of an L level. The results thus obtained are input to the encoder circuit 8 as shown in FIG. 3; as a result, an output from the encoder circuit, i.e. the result of A=2 (A2="L", A1="H", A0="L") is obtained. In this case, SCH (phase difference Y in FIG. 7B) of 1 will be provided. In this way, the SCH information corresponding to the phase difference between the horizontal sync signal S0' and 2Fsc can be obtained.

Figure 8:
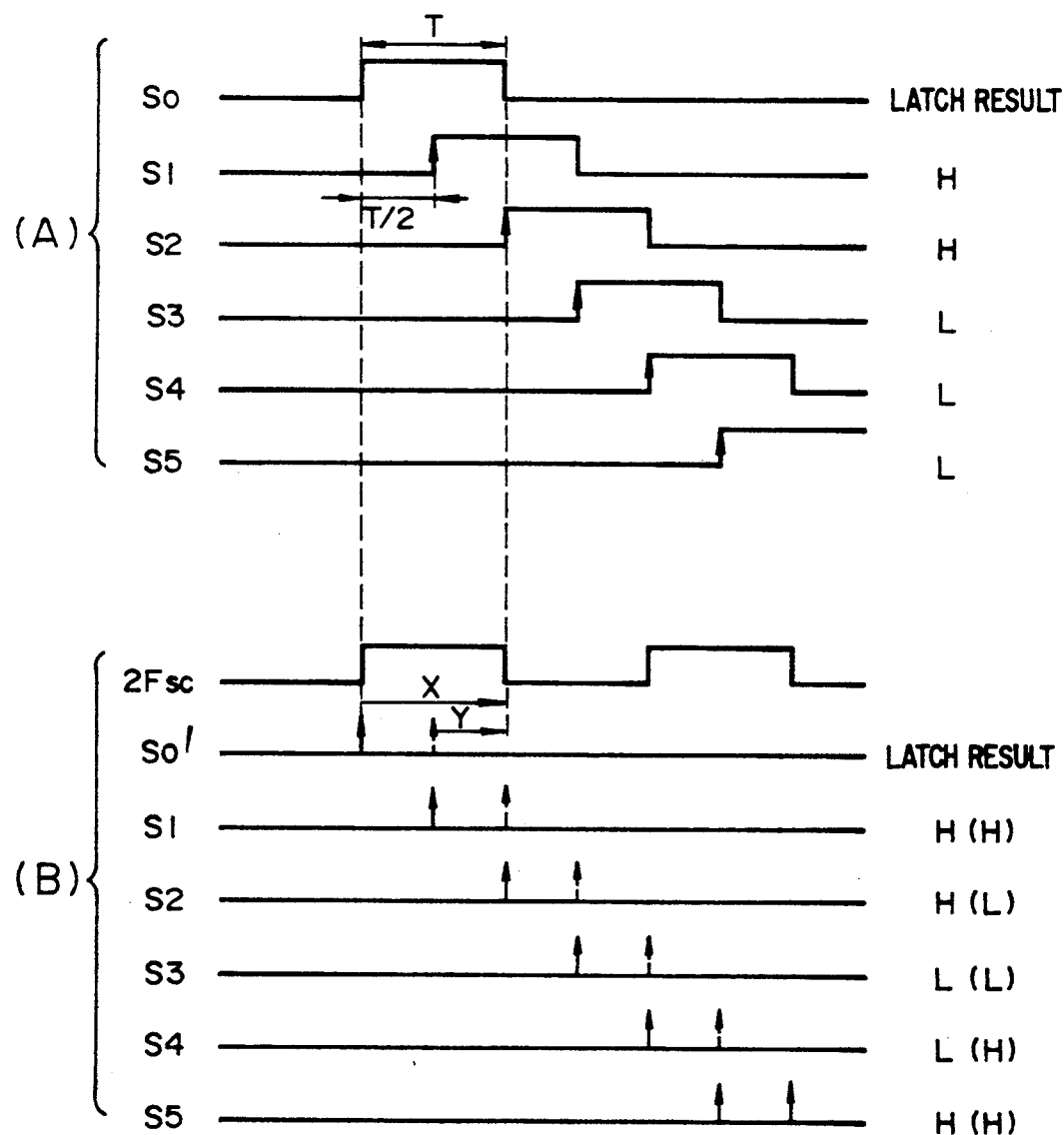

The timing charts of FIGS. 8A and 8B show the operation of the phase difference extracting device 16 when the delay amount for each stage of the delay units is T/2 which is twice as large as that in the case of FIGS. 7A and 7B.

With respect to their time base, FIGS. 8A and 8B can be regarded twice as large as FIGS. 7A and 7B so that all the values stored in the registers 131 and 132 will be half as large as those in FIGS. 7A and 7B. Since SCH can be provided as the result of division of the content of the register 132 by that of the register 131, the value of SCH will be the same value as in the case of FIGS. 7A and 7B irrespectively of the delay amount for each delay unit stage. Thus, in this case also, the SCH information corresponding to the phase difference between the horizontal sync signal S0' and 2Fsc can be obtained.

Figure 9:
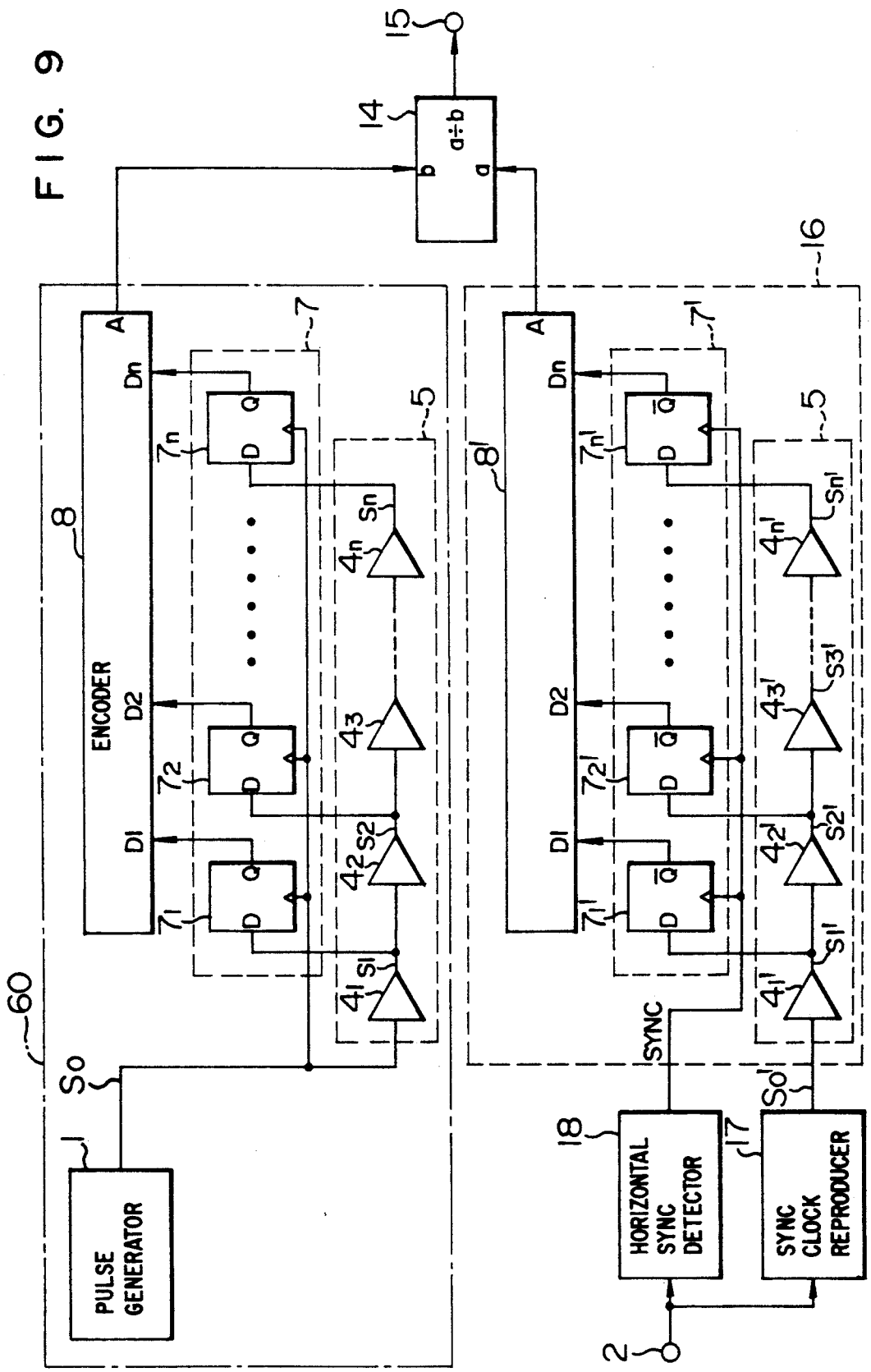
FIG. 9 is a block diagram of a second embodiment of the pulse signal phase detector.

FIG. 9 shows a second embodiment of the pulse signal phase detector according to the present invention. In FIG. 9, like reference symbols or like reference symbols with an apostrophe refer to the components with like functions in FIG. 6. It should be noted that the delay time measuring device 60 and the phase difference extracting circuit 16 are individually constructed with their hardware; the relationship between the data and latch clocks in latch circuit groups 7 and 7' in the device 60 and the circuit 16 are opposite to that in the case in FIG. 6; and the inverted outputs from the latch circuit group are supplied to an encoder 8'.

Referring to FIG. 10A, the operation of the delay time measuring device 6 will be explained. It is assumed that each pulse signal delayed by a different delay time from each of the delay units 41 to 4n is latched by each of the latch circuits 71 to 7n using the trailing edge of the original pulse signal S0. Then, as seen from FIG. 10A, latching each of the pulse signals S1, S2 and S3 provides the result of an H level whereas latching each of the pulse signals S4, S5, ..., Sn provides the result of an L level. The results thus obtained are input to the encoder circuit 8; as a result, an output from the encoder circuit, i.e. the result of A=3 (A2="L", A1="H", A0="H") is obtained.

The operation of the phase difference extracting device 16 is as follows. Now it is assumed that the input horizontal sync signal (H. SYNC) is at the timing indicated by a solid line arrow in FIG. 10B. Then, as seen from FIG. 10B, latching each of the pulse signals S1, S2 and S3 provides the result of an H level as an inversion of the latching result whereas latching each of the pulse signals S4 and S5 provides the result of an L level as an inversion of the latching result. The results thus obtained are input to the encoder circuit 8', as a result, an output from the encoder circuit, i.e. the result of A=3 (A2="L", A1="H", A0="H") is obtained Thereafter, the division result of 3/3=1 is provided by the divider 14, and thus SCH of 1 will be provided. This result is the same as in the case where in FIG. 8, the horizontal sync signal S0' is at the timing indicated by the solid line arrow. Thus, it can be understood that the second embodiment of the pulse signal phase detector as shown in FIG. 9 will provide the same operation and effect as the first embodiment thereof as shown in FIG. 6.

The following arrangement (not illustrated) can be proposed as a third embodiment of the pulse signal phase detector.

If the delay amount in each of the delay units 41 to 4n and 41' to 4n' is always stable regardless of changes in a power supply voltage or environmental temperature, the delay time measuring device 60 as shown in FIG. 9 is not required. Accordingly, the divider 14 is not required so that the output from the encoder 8' can be output as it is at the SCH information outputting terminal 15. This is because the divider 14 and the delay time measuring device 60 are provided to correct changes in the delay times of the delay units.

In accordance with the present invention, the SCH detecting circuit which was conventionally constructed with an analog circuit can be constructed with a digital circuit and also with a digital integrated circuit. Thus, the small-sized SCH detecting circuit free from correction and with high reliability can be realized. Further, in the present invention, the SCH detecting circuit is constructed using a delay line formed by a multi-stage connection in series of the delay units each having a minimum unit delay time. Specifically, a circuit for measuring the delay time of the delay line is provided to continuously measure the delay time of each delay unit, and correct the detected value of SCH on the basis of the measured delay time. Thus, even if the delay time of each delay unit is changed owing to e.g. changes in a power supply voltage or environmental temperature, SCH can always be stably detected.

Figure 11:
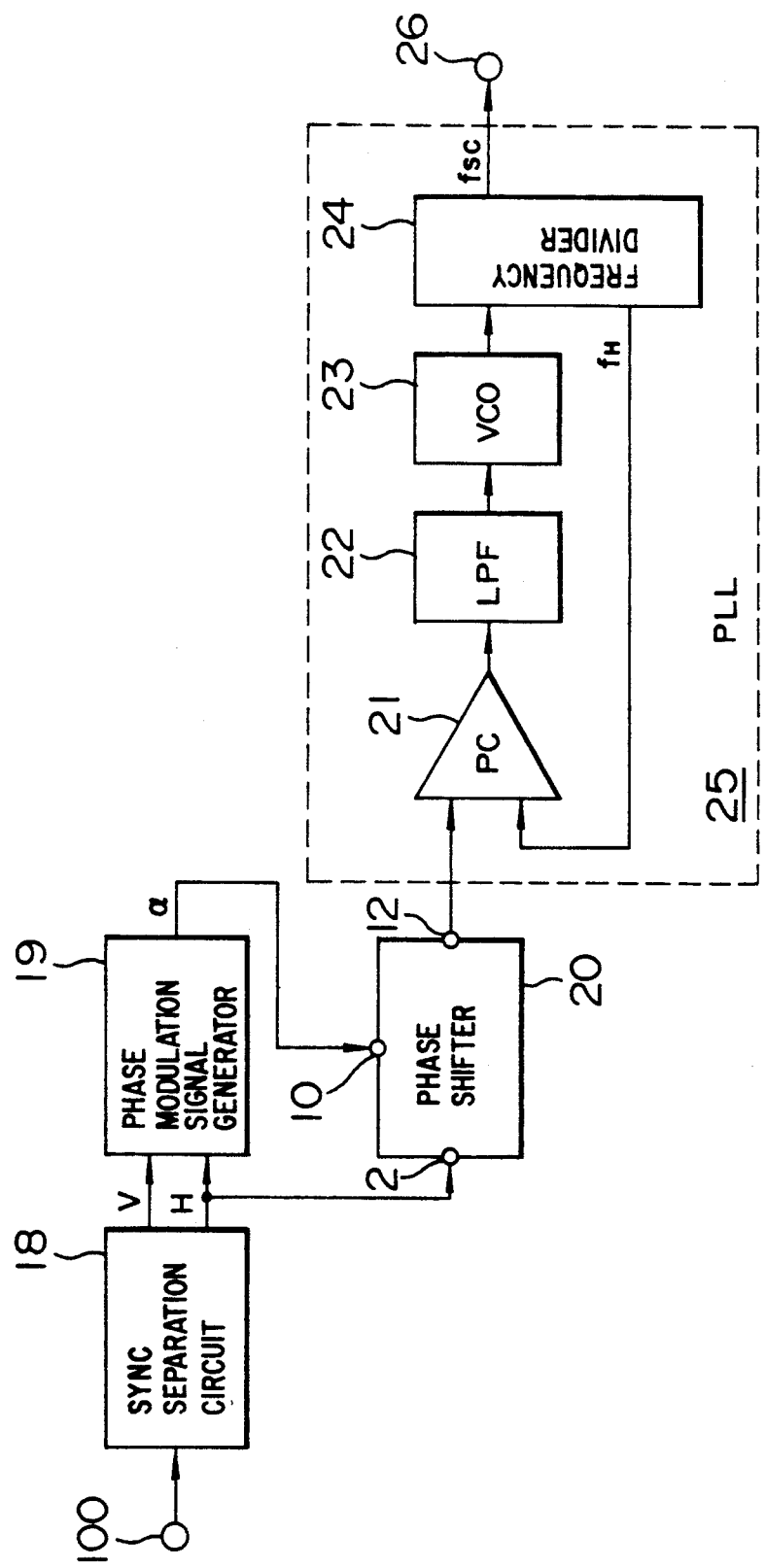
FIG. 11 is a block diagram of an embodiment of the clock generator using the pulse signal delay device according to the present invention (FIGS. 1 and 4).

Using the delay device as described above, the clock generator according to the present invention can be applied to a device for making a color subcarrier with the 25 Hz offset of a PAL signal. FIG. 11 shows an embodiment of the clock generator.

In FIG. 11, a video signal applied to an input terminal 100 is separated into a horizontal and a vertical sync signal by a sync separation device 18. A phase-modulation signal generator 19 generates a phase-modulation signal α on the basis of the horizontal and the vertical sync signal. A phase shifter (phase shifting means) 20 phase-shifts the horizontal sync signal using the phase-modulation signal α so that the phase-shifted horizontal sync signal is supplied to a PLL (phase-locked loop) (multiplying means) 25. The PLL 25 is composed of a phase comparator 21, a low pass filter 22, a voltage controlled oscillator (VOC) 23 and a frequency divider 24. The phase comparator 21 phase-compares the horizontal sync signal from the phase shifter 20 with that from the frequency divider 24 so that the output from the phase shifter 20 is frequency-multiplied to provide a color subcarrier. The clock frequency of the voltage controlled oscillator 23 is set for the frequency four times as large as the frequency (fsc) of the color subcarrier of the PAL signal; this clock is 1135-frequency-divided by the frequency divider 24 to provide a horizontal sync frequency (fH) signal. The clock from VCO 23 is also four-frequency-divided to provide the color subcarrier (fsc). The phase shifter 20 is so designed that the phase shift at the output terminal 12 for the input terminal 100 starts from a predetermined phase shift at the timing of each vertical sync signal and gradually increases until the subsequent vertical sync signal so that it is displaced by the time of a ½ cycle of the color subcarrier for a vertical scanning period.

Thus, the color subcarrier in the PAL system produced from a terminal 26 can be expressed by Equation (1)

$$fsc = (284 - \tfrac{1}{4}) \times fh + 25 \tag{1}$$

Now it should be noted that the phase modulation signal generator 19 is designed as a kind of counter. This counter is reset its count at the timing of the vertical sync signal (V) of the input video signal and thereafter counts the horizontal sync signal (H) thereof so that the phase modulation signal α with the count gradually increasing is produced. The pulse signal delay device according to the present invention as shown in FIG. 1 or 4 is used as the phase shifter 20 so that the delay is made variable on the basis of the phase modulation signal to modulate the horizontal sync signal, thereby preparing an offset component of the subcarrier of the PA signal.

In accordance with the delay device of the present invention, a circuit for measuring the delay time of the delay line is provided to continuously measure the delay time of each delay unit so that the delay time of the delay line is automatically corrected to be always fixed, thereby stabilizing the delay time of the delay line. Further, in accordance with the present invention, a distinctive stabilizing technique for the delay device which can only be realized digitally is applied to a pulse signal phase shifter, a PLL circuit and a phase-modulation signal generator, and combining them, it becomes possible to prepare a color subcarrier from the horizontal sync signal, having a 25 Hz offset in a PAL system with very high reliability.

I claim:
1. A pulse signal delay device comprising:
   delay means comprising an n-stage series connection of delay units each having a minimum unit delay time;
   delay stage number measuring means for measuring the number of stages of the n-stage delay units in said delay means which is necessary to delay a reference signal applied to said delay means by a predetermined time T and providing an output value k representing said number of stages;
   selection means for selecting an output from the individual stages of said n-stage delay units; and
   multiplying means for multiplying said output value k from said delay stage number measuring means by a coefficient α to obtain an output value αk which is provided to said selection means for controlling said selection means in terms of said output value αk to select the output from the αk-th stage of said n-stage delay units in said delay means to obtain a desired delay time αT.

2. A pulse signal delay device comprising:

delay means comprising an n-stage series connection of delay units each having a minimum unit delay time;

delay stage number measuring means for measuring the number of stages of the n-stage delay units in said delay means which is necessary to delay a reference signal applied to said delay means by a predetermined time T and providing an output value k representing said number of stages;

selection means for selecting an output from the individual stages of said n-stage delay units; and multiplying means for multiplying said output value k from said delay stage number measuring means by a coefficient $\alpha$ to obtain an output value $\alpha k$ which is provided to said selection means for controlling said selection means in terms of said output value $\alpha k$ to select the output from the $\alpha k$-th stage of said n-stage delay units in said delay means to obtain a desired delay time $\alpha T$.

wherein:

said delay stage number measuring means comprises pulse signal generating means for generating pulse signals each having a width of a predetermined time T, n latch means each corresponding to a respective one of said n-stage delay units, and encoding means for encoding outputs from said n latch means;

the pulse signal froms aid pulse signal generating means is applied to said delay means and also to the data input terminals of all of said n latch means, and the outputs from said n-stage delay units are applied to clock terminals of the corresponding latch means;

said n latch means latch the pulse signal from said pulse signal generating means using leading edges of pulse signals output from said n-stage delay units, respectively; and said encoding means examines the outputs from said n latch means in the direction of the first stage to the succeeding stage of said n-stage delay units to measure the number of stages of said n-stage delay units where a difference first appears in the output from one of said n latch means compared to the output from another one of said n latch means in a preceding stage.

3. A pulse signal delay device comprising:

delay means comprising an n-stage series connection of delay units each having a minimum unit delay time;

delay stage number measuring means for measuring the number of stages of the n-stage delay units in said delay means which is necessary to delay a reference signal applied to said delay means by a predetermined time T and providing an output value k representing said number of stages;

selection means for selecting an output from the individual stages of said n-stage delay units; and multiplying means for multiplying said output value k from said delay stage number measuring means by a coefficient $\alpha$ to obtain an output value $\alpha k$ which is provided to said selection means for controlling said selection means in terms of said output value $\alpha k$ to select the output from the $\alpha k$-th stage of said n-stage delay units in said delay means to obtain a desired delay time $\alpha T$.

wherein:

said delay stage number measuring means comprises pulse signal generating means for generating pulse signals each having a width of a predetermined time T, n latch means corresponding to a respective one of said n-stage delay units, and encoding means for encoding outputs from said n latch means;

the pulse signal froms aid pulse signal generating means is applied to said delay means and also to the clock input terminals of all of said n latch means, and the outputs from said n-stage delay units are applied to data terminals of the corresponding latch means;

said n latch means latch the pulse signal from said pulse signal generating means using trailing edges of pulse signals output from said n-stage delay units, respectively; and said encoding means examines the outputs from said n latch means in the direction of the first stage to the succeeding stage of said n-stage delay units to measure the number of stages of said n-stage delay units where a difference first appears in the output from one of said n latch means compared to the output from another one of said n latch means in a preceding stage.

* * * * *